(12) United States Patent
Roberg

(10) Patent No.: US 10,122,328 B2
(45) Date of Patent: Nov. 6, 2018

(54) BROADSIDE-COUPLED TRANSFORMER

(71) Applicant: Qorvo US, Inc., Greensboro, NC (US)

(72) Inventor: Michael Roberg, Plano, TX (US)

(73) Assignee: Qorvo US, Inc., Greensboro, NC (US)

( * ) Notice: Subject to any disclaimer, the term of this patent is extended or adjusted under 35 U.S.C. 154(b) by 45 days.

(21) Appl. No.: 15/477,525

(22) Filed: Apr. 3, 2017

(65) Prior Publication Data

US 2018/0082778 A1    Mar. 22, 2018

Related U.S. Application Data

(60) Provisional application No. 62/397,421, filed on Sep. 21, 2016.

(51) Int. Cl.
*H03H 7/38* (2006.01)
*H03F 1/56* (2006.01)
*H01P 5/00* (2006.01)

(52) U.S. Cl.
CPC .............. *H03F 1/565* (2013.01); *H01P 5/00* (2013.01); *H03H 7/38* (2013.01); *H03F 2200/387* (2013.01); *H03F 2200/541* (2013.01); *H05K 999/99* (2013.01)

(58) Field of Classification Search
CPC ...... H01F 27/2847; H01F 19/04; H01F 30/06; H01F 30/08; H03H 7/38

USPC ......... 333/32, 33, 25, 26; 336/200, 232, 223
See application file for complete search history.

(56) References Cited

U.S. PATENT DOCUMENTS

2001/0035809 A1\* 11/2001 Goff .................... H01F 17/0006
336/200

OTHER PUBLICATIONS

Bahl, Inder J., "Broadband and Compact Impedance Transformers for Microwave Circuits," IEEE Microwave Magazine, vol. 7, Issue 4, Aug. 2006, IEEE, pp. 56-62.

(Continued)

*Primary Examiner* — Stephen E Jones
(74) *Attorney, Agent, or Firm* — Withrow & Terranova, P.L.L.C.

(57) ABSTRACT

A broadside-coupled transformer is disclosed. The broadside-coupled transformer has a dielectric substrate with a first planar conductor disposed on the dielectric substrate. The first planar conductor includes first and second ends. A second planar conductor is positioned over and spaced apart from the first planar conductor. The second planar conductor includes third and fourth ends. The fourth end is electrically coupled to the first end of the first planar conductor to realize a Ruthroff transformer configuration. Support posts for supporting the second planar conductor over the first planar conductor each have a bottom attached to the dielectric substrate without contacting the first planar conductor and a top attached to a surface of the second planar conductor.

23 Claims, 6 Drawing Sheets

(56) References Cited

OTHER PUBLICATIONS

Lu, Wei Jia et al., "A Wideband Compact Broadside Coupler-based Impedance Transformer with 6:1 Bandwidth," Proceedings of the 42nd European Microwave Conference, Oct. 29-Nov. 1, 2012, Amsterdam, The Netherlands, EuMA, pp. 376-379.
Winslow, Thomas A., "A Novel Broadside Coupler Model for MMIC Impedance Transformer Design," Proceedings of the 41st European Microwave Conference, Oct. 10-13, 2011, Manchester, UK, EuMA, pp. 309-312.
Winslow, Thomas A., "Ultra Broadband Mmic Impedance Transformer," Proceedings of the 41st European Microwave Conference, Oct. 10-13, 2011, Manchester, UK, EuMA, pp. 854-857.
Zhang, Zihui et al., "Broadside-Coupled Multi-Octave Impedance Transformer," Proceedings of the 44th European Microwave Conference, Oct. 6-9, 2014, Rome, Italy, EuMA, pp. 37-40.

\* cited by examiner

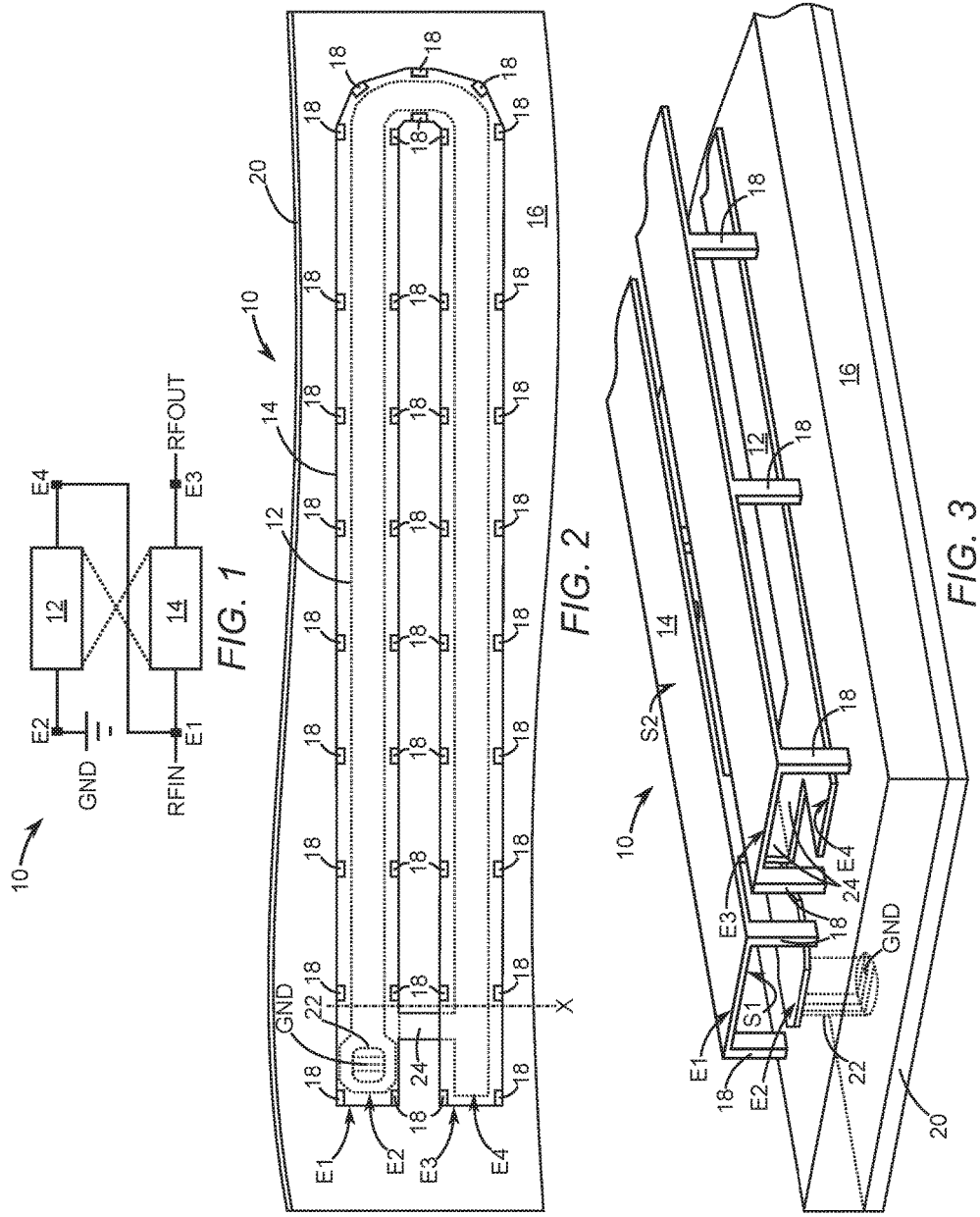

BROADSIDE-COUPLED TRANSFORMER

RELATED APPLICATIONS

This application claims the benefit of provisional patent application Ser. No. 62/397,421, filed Sep. 21, 2016, the disclosure of which is hereby incorporated herein by reference in its entirety.

FIELD OF THE DISCLOSURE

The present disclosure relates to radio frequency (RF) impedance transformers having planar conductors in a coupled configuration.

BACKGROUND

Transformers are an important component used in radio frequency (RF) circuitry. They can be used in filter circuits, in impedance matching circuits, and in transforming balanced to unbalanced (balun) circuits. Lower RF applications (low hundreds of megahertz (MHz)) traditionally use windings on a ferrite core, with the square of the ratio of primary to secondary windings (Np/Ns)2 representing an impedance ratio (Zp/Zs). The power is transferred through the ferrite core. Higher RF applications (high hundreds of MHz to gigahertz (GHz) often incorporate transmission line transformers that are constructed from planar conductors arranged on dielectric substrates. Power is generally transferred through the dielectric medium of the transmission line. Characteristic impedance of the transmission line is critical in obtaining a most efficient power transfer performance for the transformer. However, traditional transmission lines suffer from dielectric losses that limit their bandwidth at higher frequencies. Moreover, traditional transmission line geometries do not extend efficient power transmission at lower frequencies in the MHz range. What is needed is improved transformer geometry that may be optionally combined with impedance matching circuitry to extend RF bandwidth performance at both lower MHz frequencies and higher GHz frequencies.

SUMMARY

A broadside-coupled transformer is disclosed. The broadside-coupled transformer has a dielectric substrate with a first planar conductor disposed on the dielectric substrate. The first planar conductor includes first and second ends. A second planar conductor is positioned over and spaced apart from the first planar conductor. The second planar conductor includes third and fourth ends. The fourth end is electrically coupled to the first end of the first planar conductor to realize a Ruthroff transformer configuration. Support posts for supporting the second planar conductor over the first planar conductor each have a bottom attached to the dielectric substrate without contacting the first planar conductor and a top attached to a surface of the second planar conductor.

In at least one exemplary embodiment, a bandwidth of the broadside-coupled transformer is extended by an input impedance matching section coupled to an input port of the broadside-coupled transformer. The input impedance matching section is also configured as a bias injection port for an external amplifier device that typically has a radio frequency (RF) signal output coupled to the input port of the broadside-coupled transformer through the input impedance matching section. In this embodiment, the input impedance matching section and an output impedance matching section combined with a package transition comprise impedance transformation circuitry.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 is a schematic diagram of a Ruthroff type transformer configuration that is implemented using a broadside-coupled transformer that is structured in accordance with the present disclosure.

FIG. 2 is a topside view of structural elements making up the broadside-coupled transformer that includes a first planar conductor and a second planar conductor having ends electrical connected in the Ruthroff type transformer configuration of FIG. 1.

FIG. 3 is a perspective view of an end section showing the first planar conductor disposed on a dielectric substrate and the second planar conductor supported over the first planar conductor by way of support posts.

DETAILED DESCRIPTION

Figure 4:
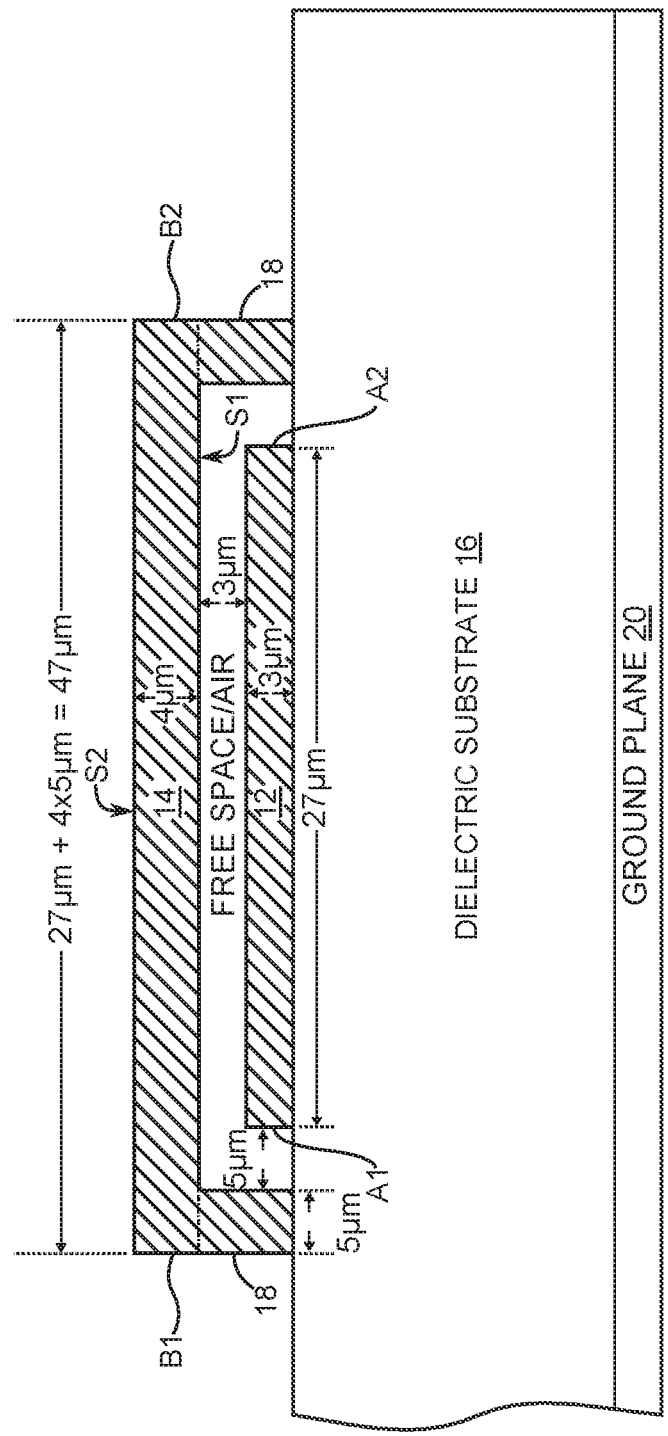
FIG. 4 is a cross-sectional view of a section of the broadside-coupled transformer of FIG. 2 showing exemplary dimensions for the first and second planar conductors as well as spacing between the two planar conductors.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 is a schematic diagram of a Ruthroff type transformer configuration that is implemented using a broadside-coupled transformer 10 that is structured in accordance with the present disclosure. The broadside-coupled transformer 10 has a first end E1, a second end E2, a third end E3, and a fourth end E4. As shown in FIG. 1, a first planar conductor 12 includes the second end E2 that is coupled to a fixed voltage node that is typically RF ground GND. A second planar conductor 14 includes the first end E1 that is used as a radio frequency (RF) signal input RFIN. The second planar conductor 14 also includes the third end E3 that is used as an RF output RFOUT. The first planar conductor 12 includes the fourth end E4 that is electrically coupled to the first end E1 of the second planar conductor 14. Crisscrossed dashed lines represent energy coupling between the first planar conductor 12 and the second planar conductor 14 when an RF signal passes between the RF input RFIN and the RF output RFOUT.

FIG. 2 is a topside view of the broadside-coupled transformer 10 connected in the Ruthroff type transformer configuration of FIG. 1. In particular, FIG. 2 shows that the first planar conductor 12 and the second planar conductor 14 are arranged over a dielectric substrate 16 in an elongated U-shaped pattern. The first end E1, the second end E2, the third end E3, and the fourth end E4 generally refer to respective sections of the first planar conductor 12 and the second planar conductor 14 that are located between the proximal extents of the second planar conductor 14 and a dotted and dashed line drawn across a top of the second planar conductor 14 and labeled X. The first planar conductor 12 is disposed on the dielectric substrate 16. The second planar conductor 14 is held in position over and spaced apart from the first planar conductor 12 by support posts 18.

FIG. 3 is a perspective view of an end section of the broadside-coupled transformer 10. FIG. 2 and FIG. 3 viewed together show the first planar conductor 12 disposed on the dielectric substrate 16 with the second planar conductor 14 supported over the first planar conductor 12 by way of the support posts 18. Each of the support posts 18 have a bottom attached to the dielectric substrate 16 without contacting the first planar conductor 12 and a top attached to a surface of the second planar conductor 14 to support the second planar conductor 14 over the first planar conductor 12 such that the second planar conductor 14 is positioned over and spaced apart from the first planar conductor 12. In the exemplary embodiment depicted in FIG. 2 and FIG. 3, the top of each of the support posts 18 is integral with an inner surface S1 of the second planar conductor 14. However, it is to be understood that the support posts 18 can be integral with or attached to other surfaces of the second planar conductor 14 such as an outer surface S2. A number of the support posts 18 needed to support the second planar conductor 14 over the first planar conductor 12 depends on the dimensions of the second planar conductor 14 and the material out of which the second planar conductor 14 is made. For example, the broadside-coupled transformer 10 depicted in FIG. 2 has the dimensions provided in FIG. 4 and is made of gold (Au). Based on these criteria, the number of support posts 18 used is forty (40), with the support posts 18 being substantially evenly spaced.

Space between the first planar conductor 12 and the second planar conductor 14 can be a vacuum or air. In this case, the inner surface S1 of the second planar conductor 14 is not directly in contact with a solid dielectric. In alternative embodiments, the space can be fully or partially occupied by other dielectric materials.

As shown in both FIG. 2 and FIG. 3, a backside of the dielectric substrate 16 has a conductive ground plane 20 disposed thereon. A conductive via 22 couples the second end E2 of the second planar conductor 14 to ground GND provided by the ground plane 20. A conductive trace 24 couples the fourth end E4 of the second planar conductor 14 to the fourth end E4 of the first planar conductor 12.

In the exemplary embodiment of FIG. 3, the conductive trace 24 is integral with the fourth end E4 of the first planar conductor 12 and also integral with the first end E1 of the second planar conductor 14. The conductive trace 24 has a section disposed onto the dielectric substrate 16 and another section that is perpendicular to the dielectric substrate 16 to extend to the first end E1 of the second planar conductor 14. The conductive trace 24 is not directly connected to the second end E2 of the first planar conductor 12. In an exemplary embodiment, the first planar conductor 12, the second planar conductor 14, the support posts 18, the via 22, the conductive trace 24, and the ground plane 20 are made of metal, which in at least one embodiment is gold (Au). Other electrically conductive materials for these items are known to those skilled in the art. The dielectric substrate 16 is made of silicon carbide (SiC) in at least one embodiment. Other dielectric substrate materials for the dielectric substrate 16 are known to those skilled in the art.

FIG. 4 is a cross-sectional view of a section of the broadside-coupled transformer 10 of FIG. 2 and FIG. 3 showing exemplary dimensions for the first planar conductor 12 and the second planar conductor 14 as well as spacing between the two. However, in an exemplary embodiment the first planar conductor 12 and the second planar conductor 14 each have a thickness that is greater than 2 μm and less than 6 μm, and in the specific example of FIG. 4, the thickness of the first planar conductor 12 is 3 μm and the thickness of the second planar conductor 14 is 4 μm. Moreover, the support posts 18 are rectangular cuboids with a width of 5 μm and a height of 10 μm. As such, the first planar conductor 12 and the second planar conductor 14 are spaced apart by 3 μm. Further still, the bottom of each post is spaced from sidewalls A1 and A2 of the first planar conductor 12 by 5 μm. The width of the first planar conductor 12 defined between sidewalls A1 and A2 is 27 μm. The width of the second planar conductor 14 defined between sidewalls B1 and B2 is 47 μm. Typically, the width of the second planar conductor 14 will be at least 20 μm wider than the first planar conductor 12. The reason for the larger width value is that some space is required for a gap between the first planar conductor 12 and the support posts 18 combined with some additional space needed to accommodate for dimensions of the support posts 18. The first planar conductor 12 typically has a width that is from 10 μm to 100 μm. Moreover, the support posts are separated and spaced from the sidewalls of the first planar conductor 12 by at least 2 μm. However, it is to be understood that the dimensions illustrated in FIG. 4 are exemplary only and that the dimensions are determined based upon given RF bandwidth specifications and desired loss characteristics. For example, the above dimensions are usable for a 4-mil silicon carbide (SiC) substrate, but the above dimensions would typically be different for a different substrate thickness of the same substrate material, or a different substrate material of the same thickness. Moreover, the support posts 18 are not constrained to having rectangular cuboid shapes. The support posts 18 can be cylindrical and other geometric shapes that are used as support structures.

Figure 5:
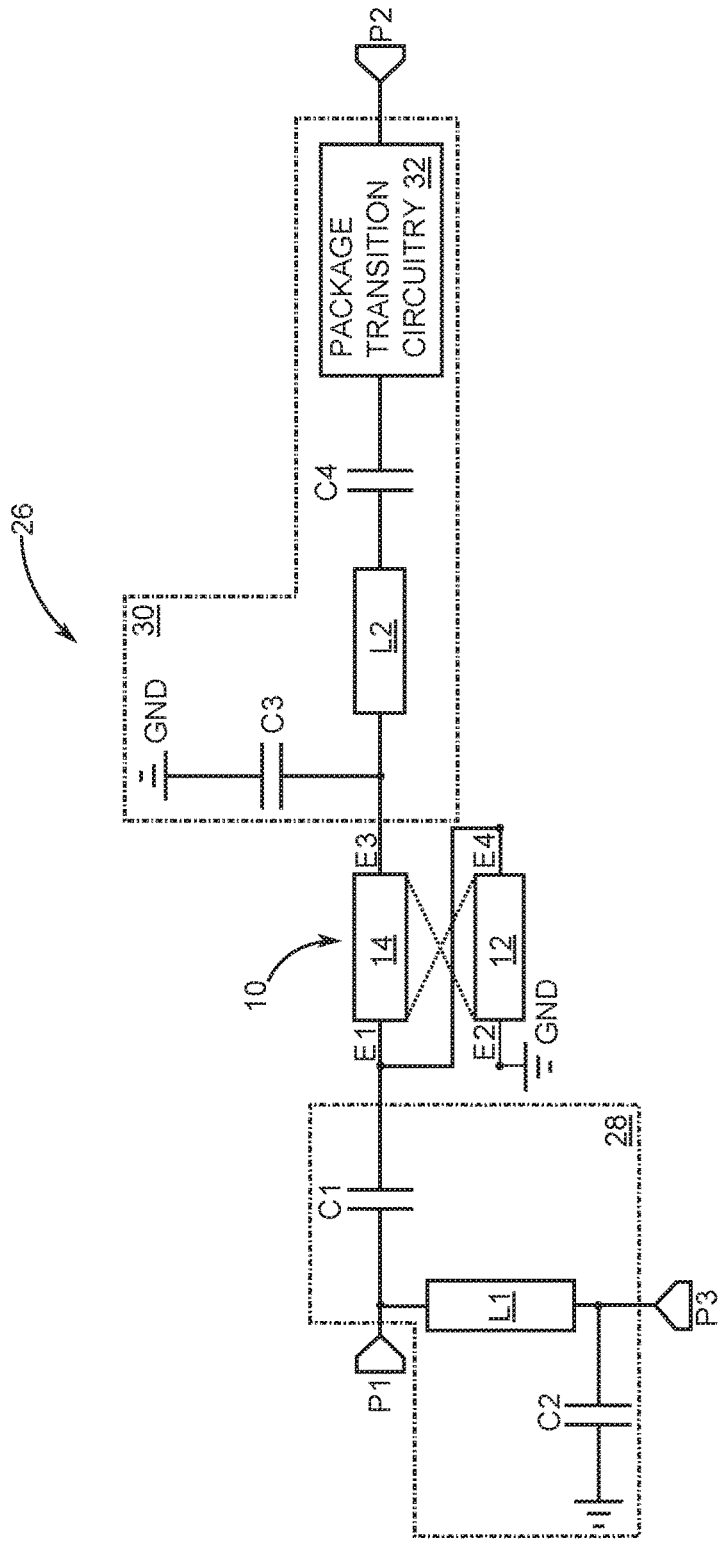
FIG. 5 is a schematic diagram of impedance transformation circuitry that includes the broadside-coupled transformer of FIG. 2 along with an input matching section that provides a bias injection port and an output matching section coupled to a package transition section.

FIG. 5 is a schematic diagram of impedance transformation circuitry 26 that includes the broadside-coupled transformer 10 of FIG. 2 and FIG. 3. The impedance transformation circuitry 26 has a first port P1 that accepts an RF signal input, a second port P2 that passes the RF signal to external components, and a third port P3 that is a bias injection port for an external amplifier that typically has an output coupled to the first port P1. An input matching circuit section 28 is coupled between the first port P1, the first end E1, the third port P3 and ground GND. The input matching circuit section 28 extends the bandwidth of the impedance transformation circuitry 26 towards lower frequencies. Moreover, in at least one embodiment, the input matching circuit section 28 is configured as a bias tee. In at least one embodiment, the input matching circuit section 28 includes a first capacitor C1 coupled between the first port P1 and the first end E1 of the broadside-coupled transformer 10. A first inductor L1 is coupled between the first port P1 and the third port P3. A second capacitor C2 is coupled between the third port P3 and ground.

An output matching circuit section 30 is coupled between the third end E3 of the broadside-coupled transformer 10 and the second port P2. In at least one embodiment, the output matching circuit section 30 includes a third capacitor C3 coupled between the third end E3 of the broadside-coupled transformer 10 and ground. The output matching circuit section 30 further includes a second inductor L2 coupled in series with a fourth capacitor C4 between the third end E3 of the broadside-coupled transformer 10 and the second port P2. The output matching circuit section 30 also further includes package transition circuitry 32 configured to provide transition impedance that is tuned to reduce RF signal reflection and loss due to parasitic impedance of wire bonds within an external component package (not shown) coupled to the second port P2. An exemplary input impedance ($Z_{IN}$) of 12.5Ω is seen looking into the input port P1. Due to the Ruthroff configuration of the broadside-coupled transformer 10, an output impedance $Z_{OUT}$ is four times the input impedance $Z_{IN}$, which in this case results in $Z_{OUT}$ equal to 50Ω.

Figure 6:
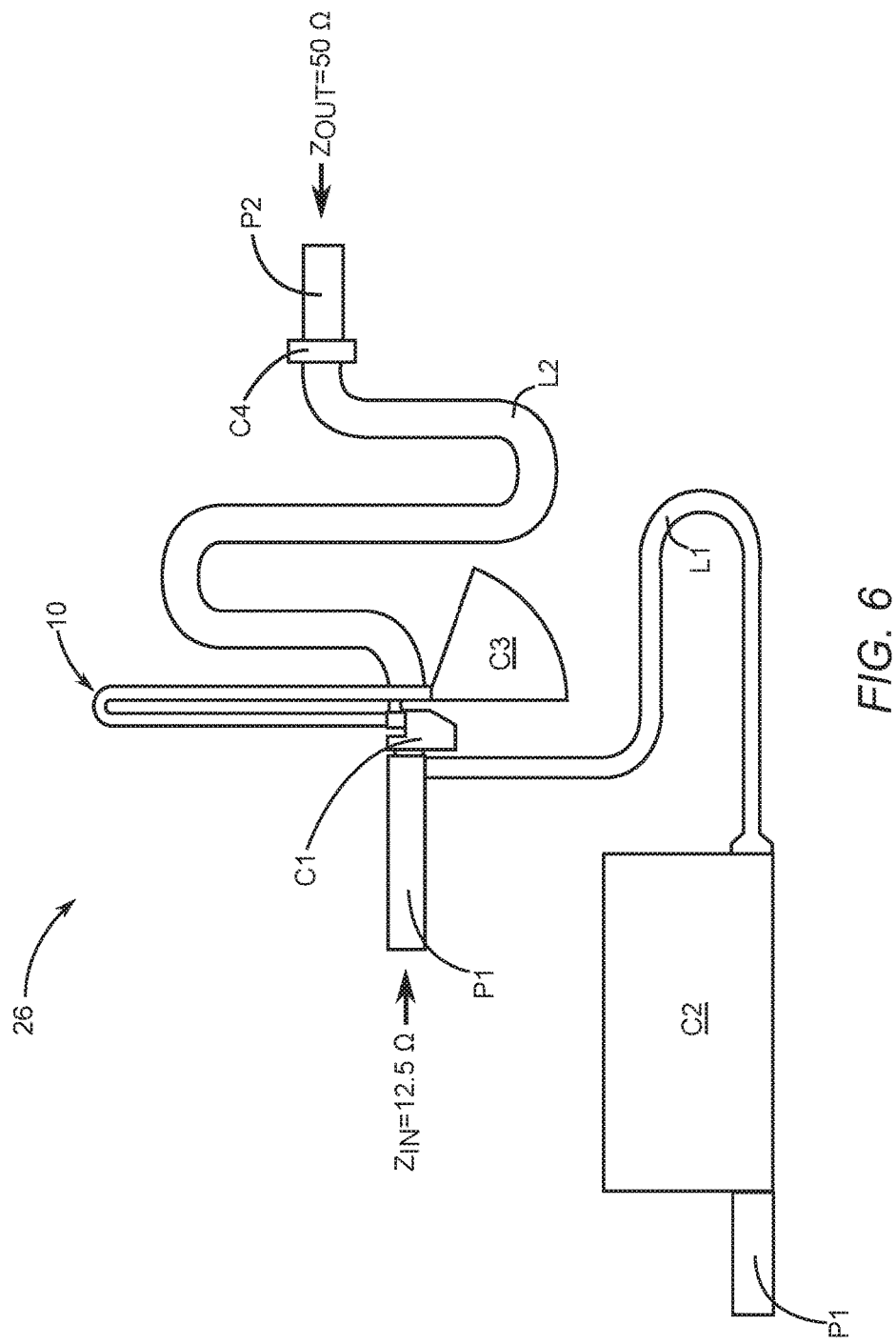
FIG. 6 is a monolithic transmission line type physical layout of the impedance transformation circuitry of FIG. 5.

FIG. 6 is a monolithic transmission line type physical layout of the impedance transformation circuitry 26 of FIG. 5. The physical layout implements a 60 μm wide shunt inductor microstrip for the first inductor L1 to provide greater than 1800 mA current handling. The exemplary physical layout for the impedance transformation circuitry 26 provides an operational bandwidth of 2-20 GHz.

Figure 7:
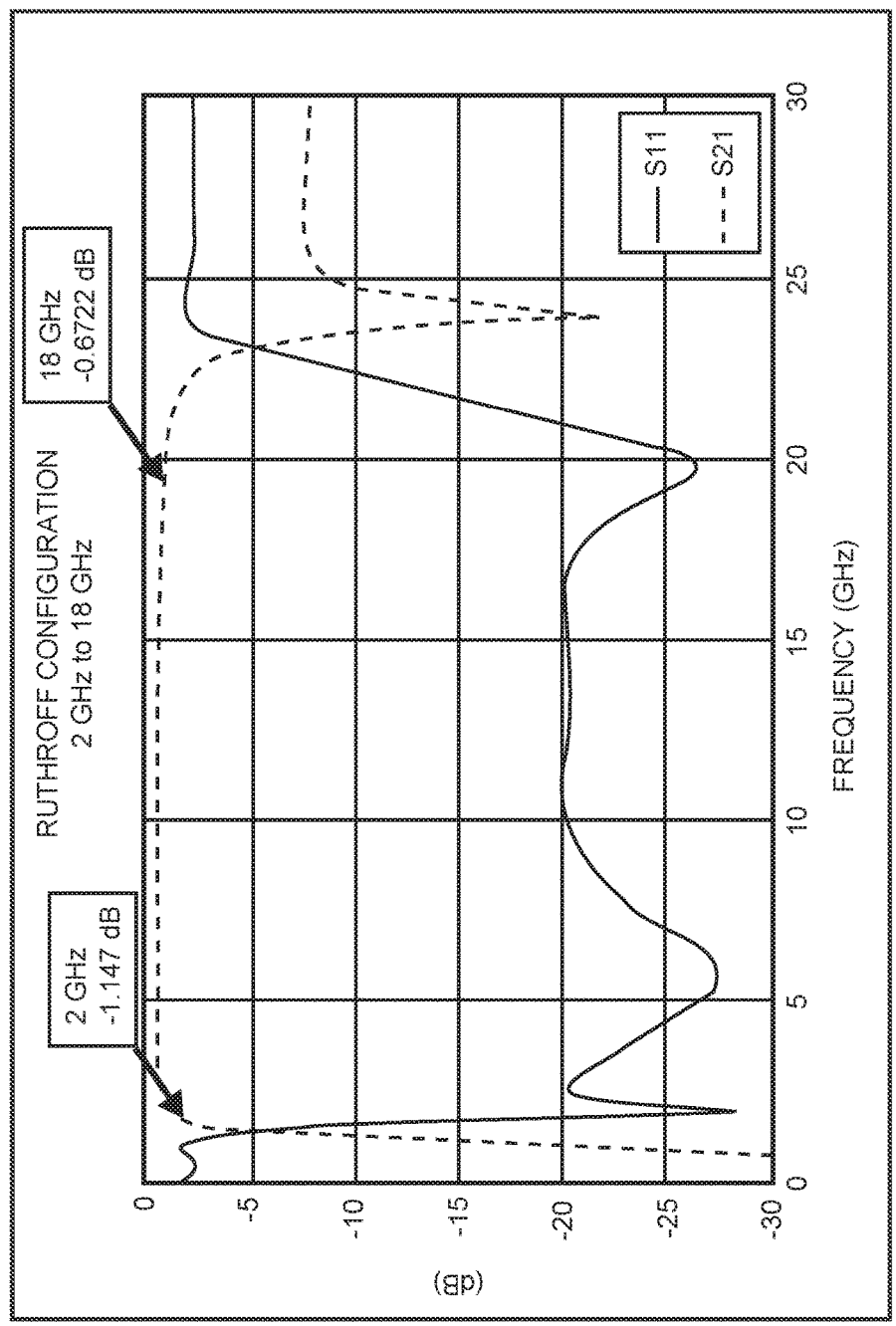
FIG. 7 is a graph of scattering parameters S11 and S21 for an exemplary embodiment of the impedance transformation circuitry of FIG. 5 and FIG. 6 for a desired bandwidth that extends from 2 GHz to 18 GHz.

FIG. 7 is a graph of scattering parameters S11 and S21 for an exemplary embodiment of the impedance transformation circuitry 26 of FIG. 5 and FIG. 6 for a desired bandwidth that extends from 2 GHz to 18 GHz. The return loss is better than 20 dB from 2-20 GHz. The loss at the high end of the band is better than 0.68 dB at 18 GHz and better than 0.93 dB at 20 GHz.

Figure 8:
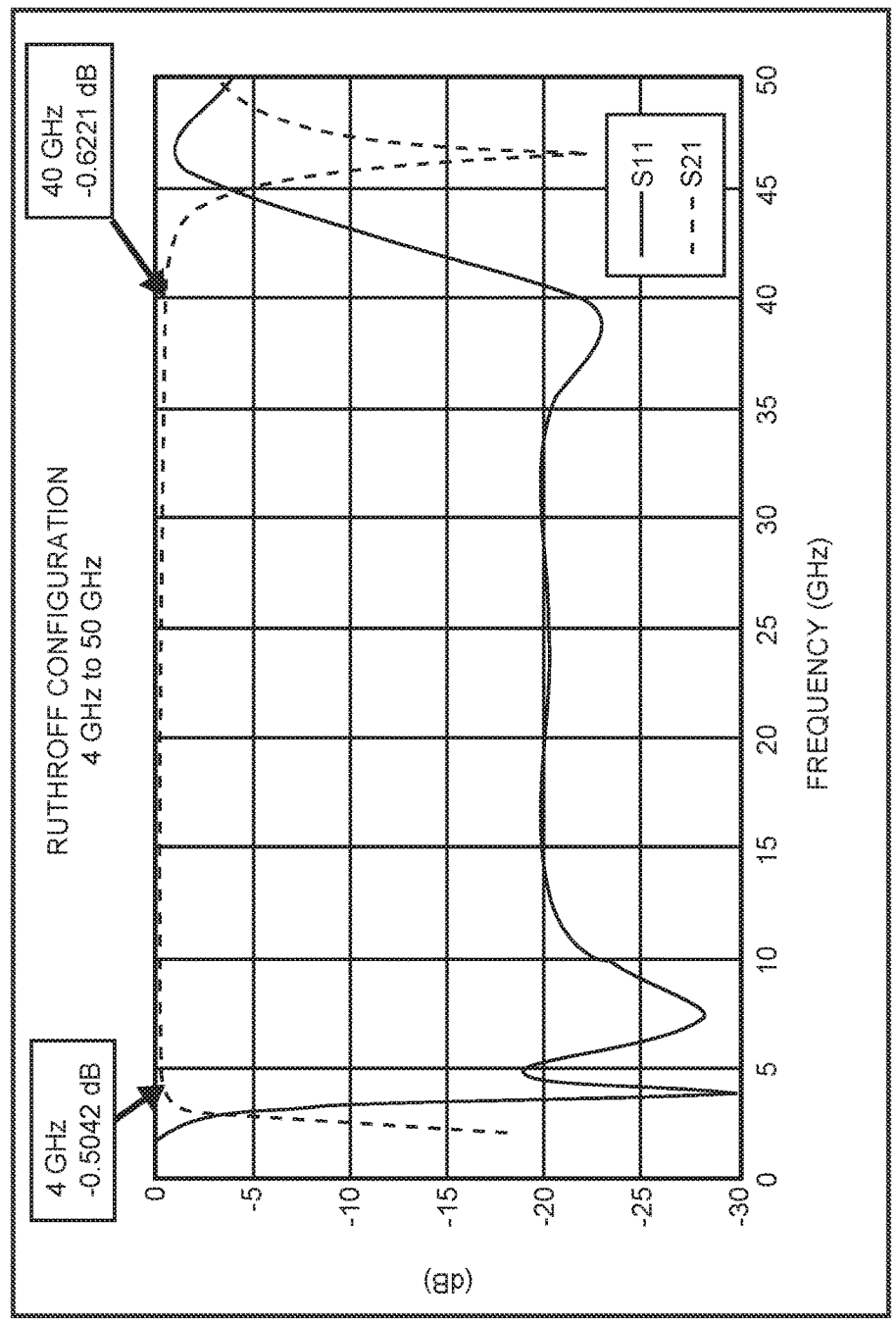
FIG. 8 is a graph of scattering parameters S11 and S21 for an exemplary embodiment of the impedance transformation circuitry of FIG. 5 and FIG. 6 for a desired bandwidth that extends from 4 GHz to 40 GHz.

FIG. 8 is a graph of scattering parameters S11 and S21 for the exemplary embodiment of the impedance transformation circuitry 26 of FIG. 5 and FIG. 6 for a desired bandwidth that extends from 4 GHz to 40 GHz. This particular graph illustrates the ability of the impedance transformation circuitry 26 to provide decade bandwidth through Ka-band. The improved low-end loss is due to the skin depth of metal making up the first planar conductor 12 and the second planar conductor 14 being lower at 4 GHz than it is at 2 GHz. The frequency limitations of the transformer are as follows. Low-end frequency will be limited due to practical size and loss due to metal thickness. The limitation on the high end of the bandwidth is the length of the first planar conductor 12 and the second planar conductor 14. At some extended frequency the first planar conductor 12 and the second planar conductor 12 cannot form the elongated U shape needed to properly couple the first end E1 and the fourth end E4. However, this issue will not occur until at least 60 GHz. Thus, some embodiments of the impedance transformation circuitry are realizable for bandwidths that extend up to at least 60 GHz.

Those skilled in the art will recognize improvements and modifications to the preferred embodiments of the present disclosure. All such improvements and modifications are considered within the scope of the concepts disclosed herein and the claims that follow.

What is claimed is:
1. A broadside-coupled transformer comprising:
a dielectric substrate;

a first planar conductor disposed on the dielectric substrate and having a first end and a second end;

a second planar conductor positioned over and spaced apart from the first planar conductor and having a third end and a fourth end wherein the fourth end is electrically coupled to the first end of the first planar conductor; and support posts that each have a bottom attached to the dielectric substrate without contacting the first planar conductor and a top attached to a surface of the second planar conductor to support the second planar conductor over the first planar conductor.

2. The broadside-coupled transformer of claim 1 wherein the first planar conductor and the second planar conductor are arranged over the dielectric substrate in an elongated U-shaped pattern.

3. The broadside-coupled transformer of claim 1 wherein space between the first planar conductor and the second planar conductor is filled with air.

4. The broadside-coupled transformer of claim 1 wherein a lower surface of the second planar conductor is not in direct contact with a solid dielectric.

5. The broadside-coupled transformer of claim 1 wherein an upper surface of the second planar conductor is not in direct contact with a solid dielectric.

6. The broadside-coupled transformer of claim 1 wherein upper and lower surfaces of the second planar conductor are not in direct contact with a solid dielectric.

7. The broadside-coupled transformer of claim 1 wherein the first planar conductor and the second planar conductor each have a thickness that is greater than 2 μm and less than 6 μm.

8. The broadside-coupled transformer of claim 1 wherein the dielectric substrate is made of silicon carbide (SiC).

9. The broadside-coupled transformer of claim 1 wherein the first planar conductor, the second planar conductor, and the support posts are made of metal.

10. The broadside-coupled transformer of claim 9 wherein the metal is gold (Au).

11. The broadside-coupled transformer of claim 1 wherein the second planar conductor has sidewalls that define a width that is at least 20 μm wider than a width defined by sidewalls of the first planar conductor.

12. The broadside-coupled transformer of claim 11 wherein the first planar conductor has a width that is from 10 μm to 100 μm.

13. The broadside-coupled transformer of claim 11 wherein the support posts are separated and spaced from the sidewalls of the first planar conductor by at least 2 μm.

14. Impedance transformation circuitry having a first port, a second port, and a third port comprising:

a broadside-coupled transformer comprising:

a dielectric substrate having a frontside and a backside, wherein the backside has a ground plane disposed thereon;

a first planar conductor disposed on the frontside of the dielectric substrate and having a first end and a second end;

a second planar conductor positioned over and spaced apart from the first planar conductor and having a third end and a fourth end wherein the fourth end is electrically coupled to the first end of the first planar conductor; and support posts that each have a bottom attached to the dielectric substrate without contacting the first planar conductor and a top attached to a surface of the second planar conductor to support the second planar conductor over the first planar conductor; and an input matching circuit section coupled between the first port, the first end of the first planar conductor, the third port and the ground plane, wherein the input matching circuit section is tuned to extend bandwidth of the broadside-coupled transformer towards lower frequencies.

15. The impedance transformation circuitry of claim 14 wherein the input matching circuit section is configured as a bias tee having a bias input coupled to the third port and a bias output coupled to the first port.

16. The impedance transformation circuitry of claim 14 wherein the first planar conductor, the second planar conductor, and the support posts are made of gold (Au).

17. The impedance transformation circuitry of claim 14 wherein the first planar conductor and the second planar conductor each have a thickness that is greater than 2 μm and less than 6 μm.

18. The impedance transformation circuitry of claim 14 wherein the input matching circuit section comprises:

a first capacitor coupled between the first port and the first end of the second planar conductor; and a first inductor coupled between the first port and the third port.

19. The impedance transformation circuitry of claim 18 wherein the input matching circuit section further includes a second capacitor coupled from the third port to ground.

20. The impedance transformation circuitry of claim 18 further including an output matching circuit section coupled between the third end of the second planar conductor and the second port.

21. The impedance transformation circuitry of claim 20 further including package transition circuitry coupled between the output matching circuit section and the second port, wherein the package transition circuitry is configured to provide transition impedance that is tuned to reduce RF signal reflection and loss due to parasitic impedance of wire bonds within an external component package coupled to the second port.

22. The impedance transformation circuitry of claim 20 wherein the output matching circuit section comprises a second inductor coupled in series with a second capacitor between the third end of the second planar conductor and the second port.

23. The impedance transformation circuitry of claim 22 wherein the output matching circuit section further includes a third capacitor coupled between the third end of the second planar conductor and ground.

* * * * *